(12) United States Patent
Kwan et al.

(10) Patent No.: US 7,532,428 B2
(45) Date of Patent: May 12, 2009

(54) SOFT TOUCH CLAMP ACTUATION MECHANISM

(75) Inventors: Ka Shing Kenny Kwan, Singapore (SG); Tingyu He, Singapore (SG)

(73) Assignee: ASM Technology Singapore Pte Ltd., Singapore (SG)

(*) Notice: Subject to any disclaimer, the term of this patent is extended or adjusted under 35 U.S.C. 154(b) by 0 days.

(21) Appl. No.: 11/624,865

(22) Filed: Jan. 19, 2007

(65) Prior Publication Data

US 2008/0174132 A1    Jul. 24, 2008

(51) Int. Cl.
*G11B 21/02*    (2006.01)
*G11B 17/00*    (2006.01)
*H02K 7/06*    (2006.01)

(52) U.S. Cl. .................... 360/75; 310/23; 360/69; 73/1.08

(58) Field of Classification Search ............ 310/12, 310/13, 14, 23; 228/4.5, 44.7, 1.1; 360/75, 360/69, 60; 73/1.08, 862.541
See application file for complete search history.

(56) References Cited

U.S. PATENT DOCUMENTS

| | | | | |
|---|---|---|---|---|
| 4,475,681 A | * | 10/1984 | Ingle | 228/4.5 |
| 5,901,896 A | * | 5/1999 | Gal | 228/4.5 |
| 6,783,052 B2 | * | 8/2004 | Liao et al. | 228/4.5 |
| 6,899,262 B2 | * | 5/2005 | Gaunekar et al. | 228/44.3 |
| 7,060,930 B2 | * | 6/2006 | Schmitt et al. | 219/98 |
| 2001/0019463 A1 | * | 9/2001 | Drouin | 360/75 |

* cited by examiner

*Primary Examiner*—J. Gonzalez
(74) *Attorney, Agent, or Firm*—Ostrolenk, Faber, Gerb & Soffen, LLP

(57) ABSTRACT

A clamping mechanism having clamping jaws is provided for holding an object. The clamping mechanism comprises a solenoid pad connected to at least one of the clamping jaws which is operative to actuate movement of the clamping jaw, and a solenoid motor that is operative to attract the solenoid pad towards it when it is energized. Further, a voice coil motor is rigidly coupled to the solenoid pad to drive the solenoid pad in directions towards or away from the solenoid motor.

8 Claims, 4 Drawing Sheets

SOFT TOUCH CLAMP ACTUATION MECHANISM

FIELD OF THE INVENTION

The invention relates to a clamping mechanism including gripping jaws for holding an object, such as a substrate of an electronic device, so as to position it.

BACKGROUND AND PRIOR ART

In back-end semiconductor assembly processes, thermosonic ball bonding is by far the most demanding. To make an interconnect between a semiconductor device (commonly called "die") and its substrate ("leadframe"), very thin wire, commonly gold wire of between 20 to 75 microns in diameter, is bonded, first onto a pad on the die and then onto the corresponding lead of the lead-frame on which the die is mounted. This process continues until all the pads and corresponding leads are connected. One leadframe may have anywhere from less than ten to a few tens of dies. In order to bring successive dies into a bonding area, a linear indexing system ("indexer"), is often used to index the leadframe with high precision. The indexer may essentially comprise a horizontal linear motor driven servo controlled stage on which are mounted two index clamps, one each for indexing leadframes near the input and output sections of a wire bonding machine respectively. Each index clamp has an actuator to control the clamping and de-clamping of the leadframe.

As requirements of both speed and accuracy of wire bonding grow more stringent, all critical subsystems of the wire bonding machine, including the indexer and the index clamp need to be made increasingly more robust, reliable and accurate. For the index clamp, this translates to a requirement of higher clamping force without undue increase in clamp mass. A clamping force of 40N may be required for the clamp for which the cycle time can vary anywhere from 2 to 60 seconds, depending upon the die size which in turn determines the number and length of the wires to be bonded. Correspondingly, the duty cycle can vary widely from 10 to 80%. This is so because at times, the index clamp needs to remain clamped near an already bonded semiconductor package even as bonding takes place on another die which is upstream on the same leadframe. This helps to guard against any possible damage to the already bonded wires due to strong vibrations of the work-holder during the bonding process.

Another requirement of the index clamp is that both its upper and lower jaws should preferably be actuated during the clamping and de-clamping actions. In earlier generation wire bonding machines, even as a leadframe was passed through the work-holder channels, it always rested on the lower jaw of the index clamp. Only the upper jaw was kept movable in order to effect the clamping action.

A conventional solenoid actuated clamp comprises a fixed solenoid and a movable solenoid plate which is free to rotate about a pivot. When the solenoid is energized with an electric current, it attracts the solenoid plate which rotates about the pivot to move a clamping jaw to clamp a substrate. The solenoid may provide a clamping force of about 50N. De-clamping of the substrate is effected by turning off the solenoid current, whereat a return spring which was compressed during the clamping action, moves the clamping jaw in an opposite direction to open the jaw.

There are several drawbacks of this design. First, since the solenoid is a highly non-linear device, its force increases rapidly as the solenoid plate approaches the solenoid. This leads to an undesirably high impact on the substrate during clamping. Secondly, since the force falls off rapidly with an increase in the gap between the solenoid and solenoid plate, there is a limit to the stroke of the plate displacement and thus a limit to the range of thickness of substrates which can be clamped.

Thirdly, the prior art affords no active control during de-clamping, but has to depend upon the return spring. In order to enable quick de-clamping action, the spring force has to be fairly high. This consumes part of the solenoid force, thus leading to a smaller clamping force than would have been possible without the spring. Thus, in order to effect a required level of clamping force, the solenoid has to be larger in size.

An improved actuation mechanism is described in U.S. Pat. No. 6,783,052 entitled "Clamp Actuation Mechanism", which discloses an actuation system to actuate clamping and de-clamping of a clamping mechanism. The actuation system comprises a variable reluctance actuator such as a solenoid that is operatively coupled to a linear induction actuator such as a cylindrical linear motor that cooperate to provide an actuation force to the clamping mechanism. The cylindrical motor comprises a cylindrical magnet creating a magnetic field within which a coil is movable by electromagnetic interaction.

Whilst such a design can avoid imparting too much impact onto the substrate during clamping, one problem is that the cylindrical voice coil motor that is used provides a relative lower clamping force than a solenoid of the same weight. Thus, it is less effective in providing a high clamping force. A lower clamping force makes it more likely that a substrate may slip during indexing motion.

SUMMARY OF THE INVENTION

It is thus an object of the present invention to seek to provide an actuator which is capable of driving gripping jaws of a clamping mechanism over a wider travel range to enable it to clamp thicker substrates.

It is another object of the invention to seek to provide an actuator that offers a more effective gripping force relative to its size while avoiding some of the disadvantages of the aforesaid prior art.

According to a first aspect of the invention, there is provided a clamping mechanism having clamping jaws for holding an object, comprising: a solenoid pad connected to at least one of the clamping jaws and operative to actuate movement of the clamping jaw; a solenoid motor that is operative to attract the solenoid pad towards it when it is energized; and a voice coil motor that is rigidly coupled to the solenoid pad and which is operative to drive the solenoid pad in directions towards or away from the solenoid motor.

According to a second aspect of the invention, there is provided a method for holding an object using a clamping mechanism having clamping jaws, at least one of the clamping jaws being connected to a solenoid pad, the method comprising the steps of: moving the solenoid pad towards a solenoid motor using a voice coil motor that is rigidly coupled to the solenoid pad so as to close the clamping jaws onto the object, substantially without attracting the solenoid pad with the solenoid motor; and thereafter energizing the solenoid motor to attract the solenoid pad and provide a clamping force on the object once the clamping jaws have closed on the object.

It will be convenient to hereinafter describe the invention in greater detail by reference to the accompanying drawings, which illustrate one embodiment of the invention. The particularity of the drawings and the related description is not to be understood as superseding the generality of the broad identification of the invention as defined by the claims.

BRIEF DESCRIPTION OF THE DRAWINGS

An example of a preferred embodiment of a clamp actuation mechanism in accordance with the invention will now be described with reference to the accompanying drawings, in which.

DETAILED DESCRIPTION OF THE PREFERRED EMBODIMENT OF THE INVENTION

Figure 1:
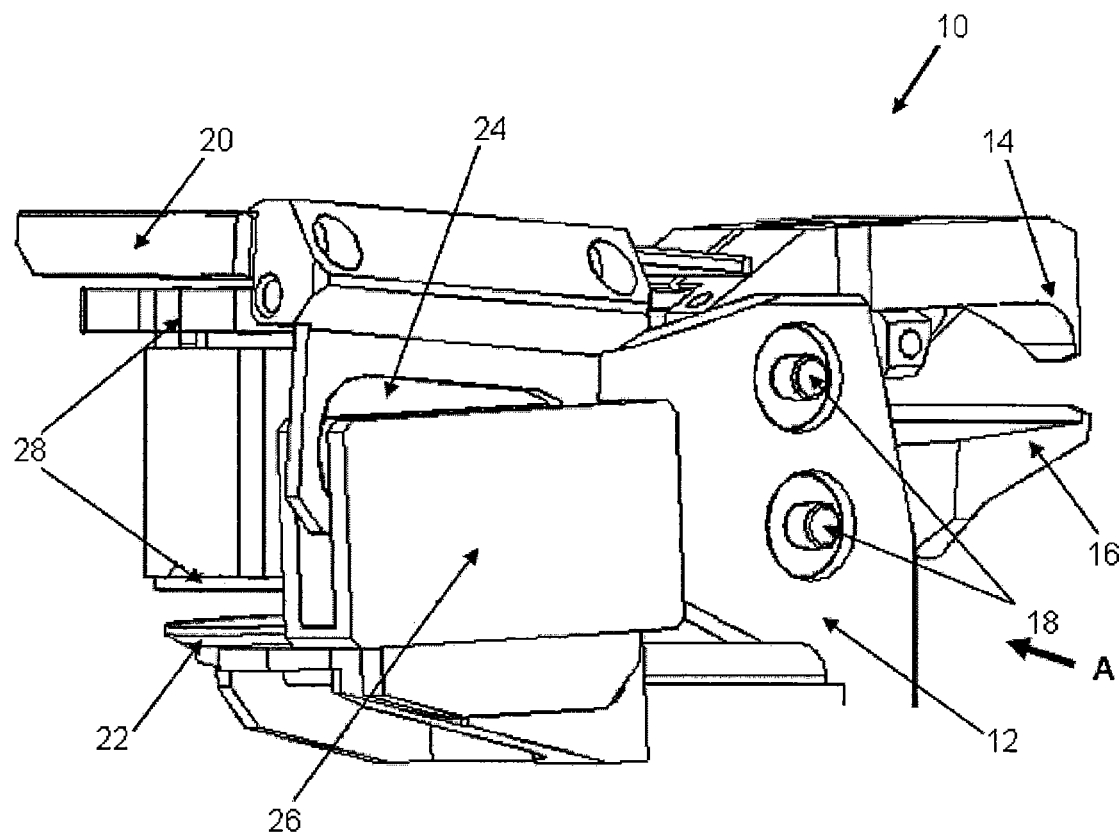
FIG. 1 is an isometric view of a clamping mechanism according to the preferred embodiment of the invention.

FIG. 1 is an isometric view of a clamping mechanism 10 according to the preferred embodiment of the invention. The clamping mechanism 10 has a support structure 12 and clamping jaws comprising an upper clamping jaw 14 and a lower clamping jaw 16 fixed onto the support structure 12. The upper and lower clamping jaws 14, 16 are pivotally mounted on the support structure 12 with pivots 18 so that they may rotate relative to the support structure 12 during opening and closing of the clamping mechanism 10.

The lower clamping jaw 16 is connected to a first solenoid pad, such as upper solenoid pad 20, and the upper clamping jaw is connected to a second solenoid pad, such as lower solenoid pad 22. The solenoid pads 20, 22 are operative to actuate opening and closing motion of the clamping jaws 14, 16. In a case where only one clamping jaw is movable and the other clamping jaw is fixed, only one solenoid pad would be required.

The upper and lower solenoid pads 20, 22 are attracted towards opposite ends of a solenoid motor in the form of solenoid 28 when the solenoid 28 is energized. Accordingly, the solenoid 28 is preferably located between the two solenoid pads 20, 22. When the solenoid pads 20, 22 are attracted towards the solenoid 28, the clamping jaws 14, 16 will rotate towards a closed position for clamping an object, such as a leadframe or other substrate of an electronic device.

Each upper and lower solenoid pad 20, 22 is further connected to a part of a voice coil motor assembly, comprising a first component in the form of a coil bracket 24 incorporating coils for carrying an electric current, and a second component in the form of a magnet assembly 26 including a plurality of magnets. The voice coil motor assembly is rigidly coupled to the respective solenoid pads 20, 22 in order to drive each solenoid pad in directions towards or away from the solenoid 28. As compared to the prior art, rigid coupling of each component of the voice coil motor assembly to a respective solenoid pad allows greater precision in controlling the position of the solenoid pad as compared to when the coupling is flexible.

In the illustrated embodiment, the upper solenoid pad 20 is rigidly coupled to the coil bracket 24, and separately, the lower solenoid pad 22 is rigidly coupled to the magnet assembly 26. Alternatively, the upper solenoid pad 20 may be rigidly coupled to the magnet assembly 26 and the lower solenoid 22 may be rigidly coupled to the coil bracket 24. Depending on a direction of current flow in the coils carried by the coil bracket 24, the solenoid pads 20, 22 may be driven to move towards or away from the solenoid 28, so that the clamping jaws may be moved towards closed or opened positions respectively.

Figure 2:
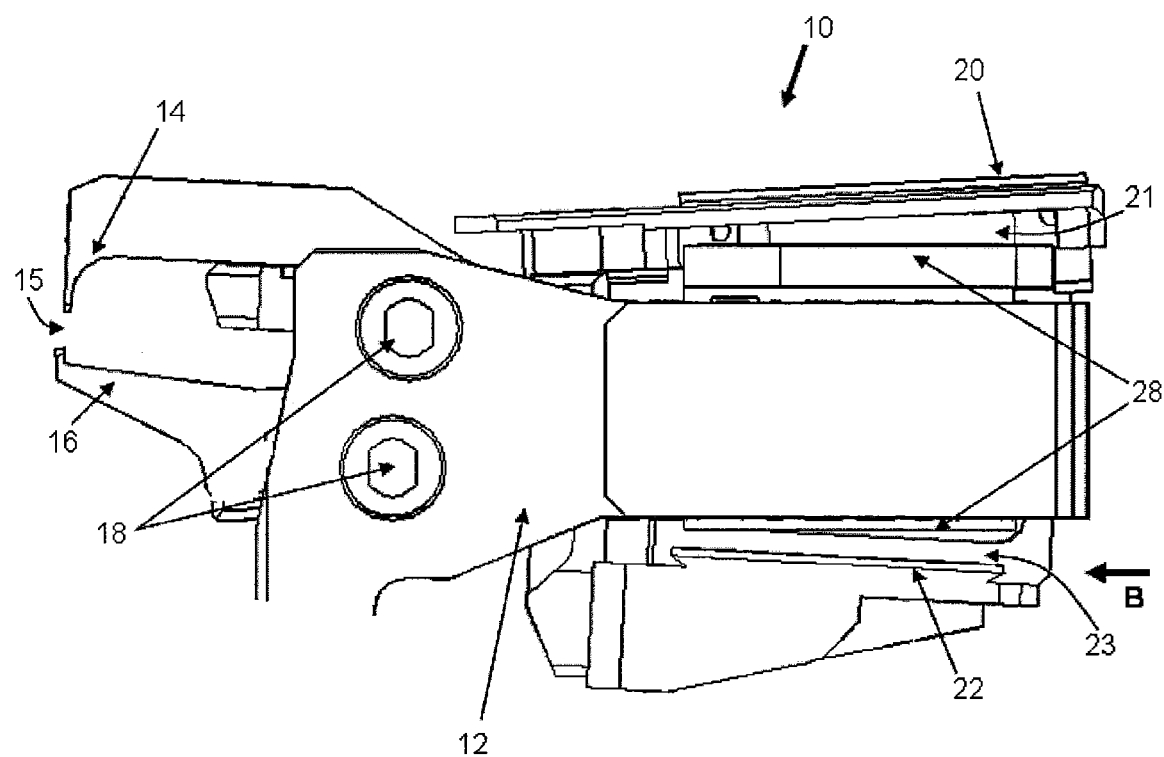
FIG. 2 is a side view of the clamping mechanism looking from direction A of FIG. 1.

FIG. 2 is a side view of the clamping mechanism 10 looking from direction A of FIG. 1. In the illustration, there are gaps 21, 23 between the respective upper and lower solenoid pads 20, 22 and the solenoid 28. Therefore, there is a corresponding gap 15 between the upper and lower clamping jaws 14, 16. When the lower solenoid pad 22 is driven towards the solenoid 28, the upper clamping jaw 14 will rotate about the pivot 18 and move towards the lower clamping jaw 16. Concurrently, when the upper solenoid pad 20 is driven towards the solenoid 28, the lower clamping jaw 16 would rotate about the pivot 18 and move towards the upper clamping jaw 14. Finally, the upper and lower clamping jaws 14, 16 are closed to perform the clamping operation.

Figure 3:
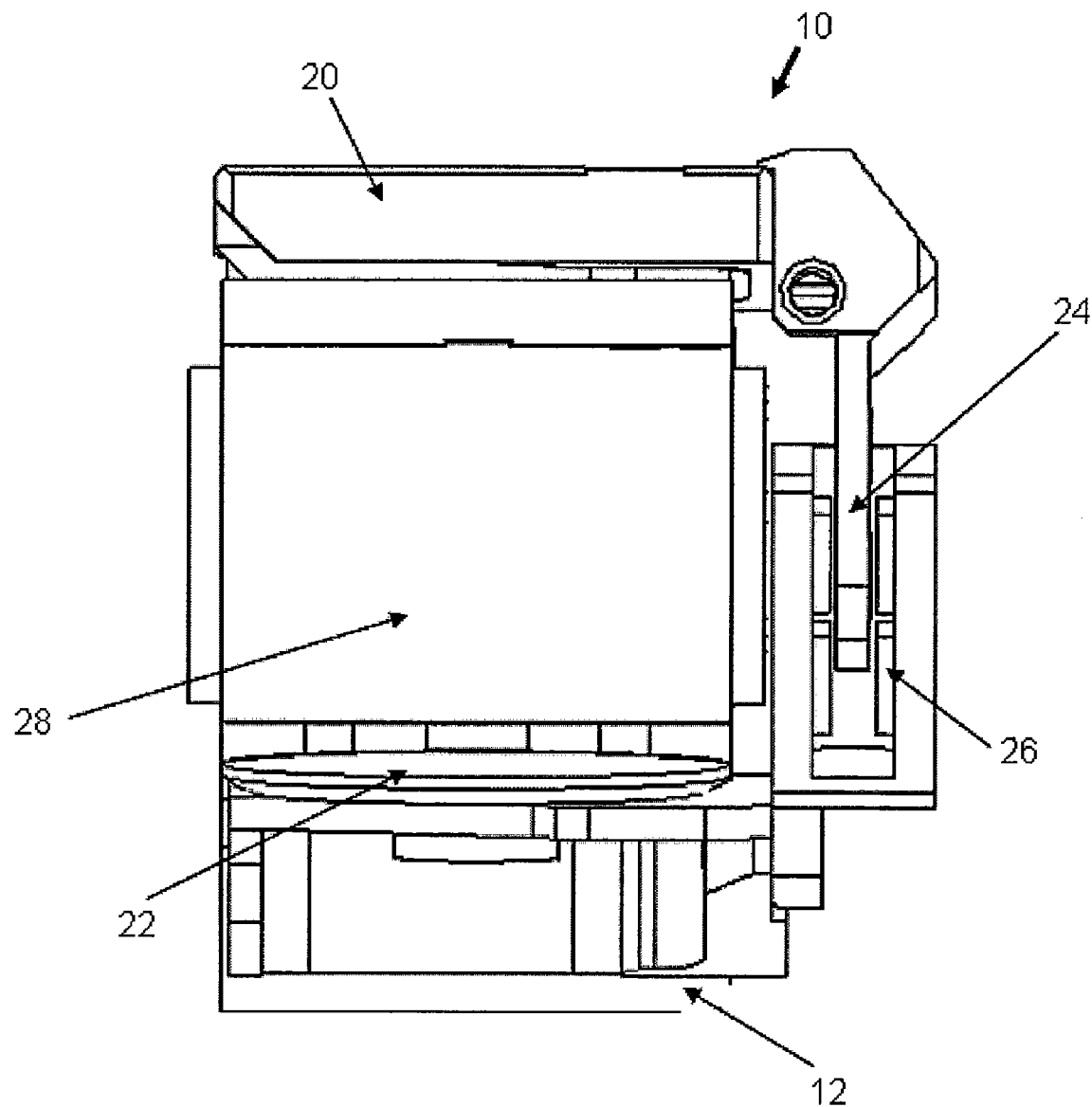
FIG. 3 is an end view of the clamping mechanism looking from direction B of FIG. 2.

FIG. 3 is an end view of the clamping mechanism 10 looking from direction B of FIG. 2. In addition to the solenoid 28 and the respective upper and lower solenoid pads 20, 22, the view gives a clearer illustration of a substantially planar construction of the coil bracket 24, which is disposed in an air gap that is at least partially enclosed by the magnet assembly 26. The coil bracket 24 and the magnet assembly 26 are configured to move relative to each other as a result of electromagnetic interaction. Depending on the direction of current flow within the coils incorporated on the coil bracket 24, the coil bracket 24 would either move further into the enclosure formed by the magnet assembly 26, or move in the opposite direction. In either case, the movement of the coil bracket 24 and/or the magnet assembly 26 drives movement of the upper solenoid pad 20 and/or the lower solenoid pad 22 to which they are respectively connected.

Preferably, the solenoid 28 is configured to receive a first current and the voice coil motor is configured to receive a second current that is separate from the first current. This enables the two motors to be controlled separately, as demonstrated by the illustration of the clamping mechanism 10 in operation with reference to FIG. 4. As a result, the upper and lower clamping jaws 14, 16 are drivable to open or close by the voice coil motor. In operation, the voice coil motor would be operative primarily to open or close the clamping jaws 14, 16, whereas the solenoid 28 would be operative primarily to apply a clamping force once the clamping jaws 14, 16 close onto a substrate.

Figure 4:
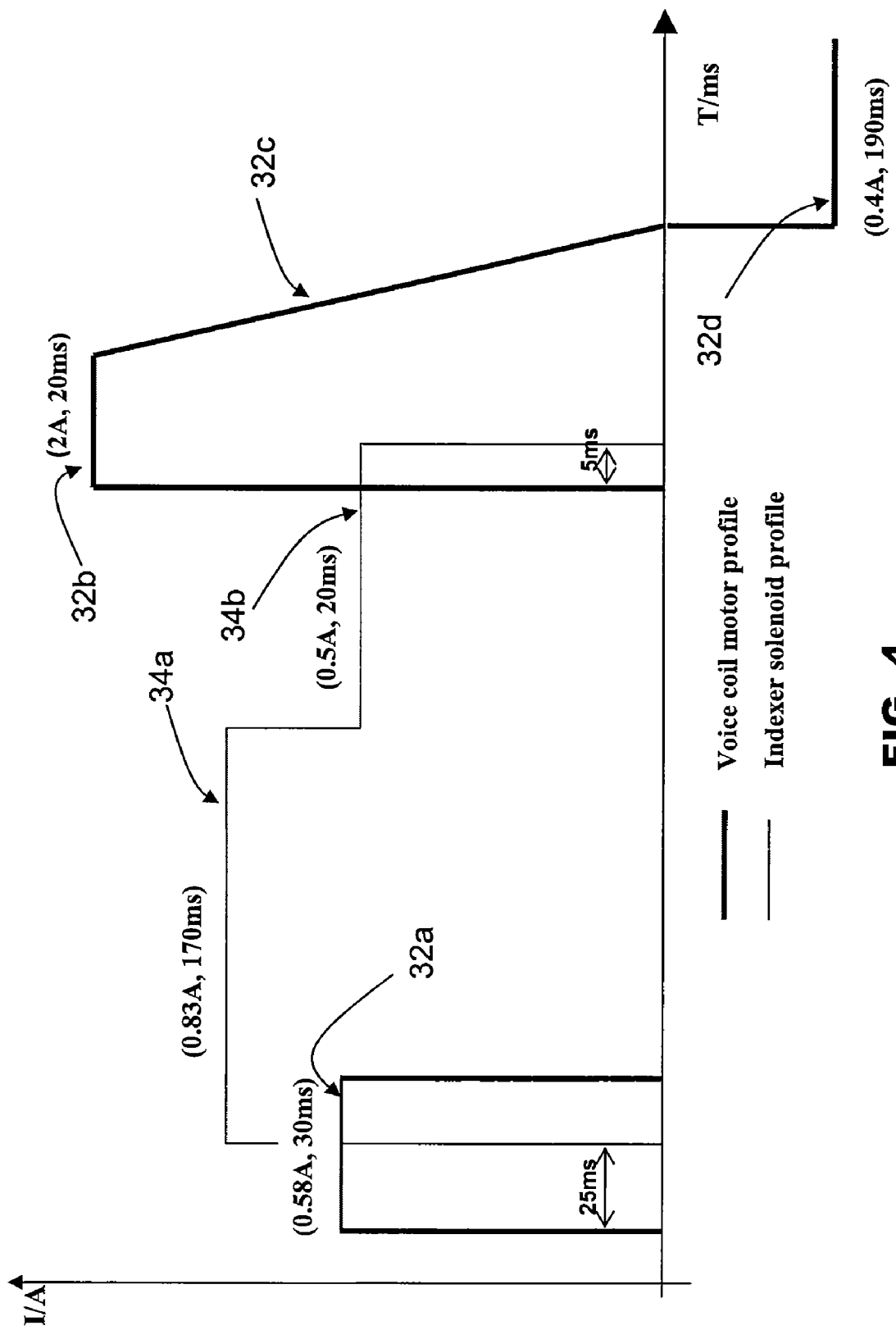
FIG. 4 is a graphical illustration of an exemplary current-time profile showing the activation periods of the respective actuators during a typical indexing operation.

FIG. 4 is a graphical illustration of an exemplary current-time profile showing the activation periods of the respective actuators during a typical indexing operation. Graphical line 32 relates to the voice coil motor comprising the coil bracket 24 and magnet assembly 26, and graphical line 34 relates to the solenoid 28.

The voice coil motor is first activated to move the solenoid pads 20, 22 towards the solenoid 28. During this time, the solenoid 28 should substantially not attract the solenoid pads 20, 22. A first current 32a (say, 0.58A) is delivered to the coil bracket 24 for a first duration (say, 30 ms). Within that duration (say, after about 25 ms), a second current 34a (say, 0.83A) is delivered to the solenoid 28. By this time, the clamping jaws 14, 16 are preferably already clamping onto a substrate.

Since the voice coil motor force constant remains the same along the full travel range of the coil bracket 24 and magnet assembly 26, this allows the clamping jaws 14, 16 to travel a long distance so that the clamping jaws 14, 16 may create a gap 15 that is large enough for all kinds of substrate thickness. Moreover, the voice coil motor allows the clamping jaws 14, 16 to close gently and rapidly via the input of a simple current-time profile due to the consistent motor force constant.

However, the solenoid 28 will be activated to provide a main clamping force after the clamping jaws 14, 16 close onto the substrate. This minimizes the force impact on the substrate. The first current 32a is terminated to deactivate the voice coil motor once the solenoid 28 is activated with the second current 34a to apply the clamping force, so that eventually the clamping force is delivered solely by the solenoid 28.

When the clamping jaws 14, 16 need to be unclamped, a third current 34b which is lower than the second current 34a is delivered to the solenoid 28. Although at this point, a high clamping force is no longer necessary, this lower clamping force is applied to avoid abrupt opening of the clamping jaws 14, 16. Therefore, the clamping jaws 14, 16 would still be clamping onto the substrate, albeit with a lower force. Before the third current 34b is terminated, a fourth current 32b (say, 2A) is provided to the voice coil motor. This fourth current is operative to hold the solenoid pads 20, 22 to damp any vibration experienced during unclamping of the clamping jaws 14, 16.

At this moment, since the substrate is heated up to 150° C. or above, thermo stress in the substrate may concentrate around the clamping area. Unclamping the clamping jaws 14, 16 will be accompanied by the release of thermo stress and clamping mechanism force stress. The fourth current 32b is thus applied to replace the solenoid clamping force. After a short time from the provision of the fourth current 32b (say, for another 5 ms), the third current 34b is terminated. After about 20 ms, after any vibration due to the termination of the solenoid clamping force dissipates, the fourth current is gradually reduced 32c until it is terminated, and the remaining stress is gradually released.

After the fourth current is terminated, a fifth current 32d (say, 0.4A) is applied to drive the solenoid pads away from the solenoid 28 to open the clamping jaws 14, 16. After a short time from the provision of the fifth current 32d (say, for 20 ms), after the clamping jaws 14, 16 have been separated and the clamping jaws 14, 16 are in the open position, the clamping mechanism 10 may move to another position to clamp the substrate again to index it or to clamp another substrate for indexing.

Using the voice coil motor to drive the opening of the clamping jaws 14, 16 helps to eliminate the use of a spring to force open the clamping jaws, so this helps to reduce the weight of the solenoid 28 because it is not necessary to have a larger clamping force to overcome any return spring force during clamping.

It should be appreciated that the clamping mechanism according to the preferred embodiment of the invention minimizes vibration caused to the substrate during clamping and unclamping, and this minimizes bonded wire deformation during substrate indexing. Since some devices are carried by a device carrier instead of a substrate, the impact force during clamping may cause the device to jump up and vibrate on the device carrier, leading to defects. By using the relatively linear force from the voice coil motor to move the upper and lower clamping jaws 14, 16, and then using the relatively high solenoid clamping force only after the substrate has been clamped, such high impact forces during clamping can be avoided.

Advantageously, the weight of the solenoid 28 can be reduced, and the voice coil motor design is also made simple and lightweight. Thus, the clamping mechanism 10 may maintain the same speed and accuracy without any increase in the index motor power that is necessary in conventional solenoid-driven clamping mechanisms.

The invention described herein is susceptible to variations, modifications and/or additions other than those specifically described and it is to be understood that the invention includes all such variations, modifications and/or additions which fall within the spirit and scope of the above description.

The invention claimed is:

1. A clamping mechanism having clamping jaws for holding an object, the clamping mechanism comprising:
   a solenoid pad connected to at least one of the clamping jaws and operative to actuate movement of the at least one clamping jaw;
   a solenoid operative to attract the solenoid pad towards the solenoid when the solenoid is energized, the solenoid being energized by a first current; and
   a voice coil motor that is fixedly coupled to the solenoid pad and is operative to drive the solenoid pad towards and away from the solenoid, the voice coil motor being energized by a second current, the second current being separate from and electrically unconnected to the first current such that the first current does not energize the voice coil motor and the second current does not energize the solenoid.

2. The clamping mechanism as claimed in claim 1, wherein the voice coil motor comprises a magnet assembly and a coil bracket, the coil bracket including current-carrying coils, the magnet assembly and the coil bracket being movable relative to each other, and wherein the solenoid pad is fixedly coupled to one of the magnet assembly and the coil bracket.

3. The clamping mechanism as claimed in claim 2, wherein the solenoid pad is fixedly coupled to the coil bracket.

4. The clamping mechanism as claimed in claim 2, wherein the magnet assembly includes an air gap formed therein, and wherein the coil bracket is of a substantially planar construction and is disposed within the air gap.

5. The clamping mechanism as claimed in claim 1, further comprising a second solenoid pad connected to another clamping jaw for actuating the movement of the other clamping jaw, wherein the two solenoid pads are arranged such that the solenoid is located between the two solenoid pads.

6. The clamping mechanism as claimed in claim 5, wherein one solenoid pad is fixedly coupled to a first component of the voice coil motor and the second solenoid pad is fixedly coupled to a second component of the voice coil motor that is movable with respect to the first component.

7. The clamping mechanism as claimed in claim 1, wherein the voice coil motor is operative to provide a relatively weaker force to move the solenoid pad relative to the solenoid, and the solenoid is operative to provide a relatively stronger clamping force for clamping the object.

8. A clamping mechanism having clamping jaws for holding an object, the clamping mechanism comprising:
   a solenoid pad connected to at least one of the clamping jaws and operative to actuate movement of the at least one clamping jaw;

a solenoid operative to attract the solenoid pad towards the solenoid when the solenoid is energized, the solenoid being energized by a first current provided by a first current source; and a voice coil motor that is fixedly coupled to the solenoid pad and is operative to drive the solenoid pad towards and away from the solenoid, the voice coil motor being energized by a second current provided by a second current source, the second current source being separate from and electrically unconnected to the first current source such that the first current does not energize the voice coil motor and the second current does not energize the solenoid.

* * * * *